US011575029B2

(12) United States Patent
Derrickson et al.

(10) Patent No.: US 11,575,029 B2
(45) Date of Patent: Feb. 7, 2023

(54) LATERAL BIPOLAR JUNCTION TRANSISTOR AND METHOD

(71) Applicant: GLOBALFOUNDRIES U.S. Inc., Malta, NY (US)

(72) Inventors: Alexander M. Derrickson, Saratoga Springs, NY (US); Richard F. Taylor, III, Campbell, CA (US); Mankyu Yang, Fishkill, NY (US); Alexander L. Martin, Greenfield Center, NY (US); Judson R. Holt, Ballston Lake, NY (US); Jagar Singh, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/324,183

(22) Filed: May 19, 2021

(65) Prior Publication Data
US 2022/0376093 A1   Nov. 24, 2022

(51) Int. Cl.
*H01L 27/082* (2006.01)
*H01L 27/12* (2006.01)
(Continued)

(52) U.S. Cl.
CPC ............ *H01L 29/735* (2013.01); *H01L 21/84* (2013.01); *H01L 27/1203* (2013.01);
(Continued)

(58) Field of Classification Search
CPC ............ H01L 29/0649; H01L 29/0642; H01L 29/0646; H01L 29/0657; H01L 29/0817;
(Continued)

(56) References Cited

U.S. PATENT DOCUMENTS 5,605,850 A * 2/1997 Villa ................... H01L 29/1004
438/335
6,638,807 B2   10/2003 Forbes et al.
(Continued)

FOREIGN PATENT DOCUMENTS

EP          0 657 944 A2    12/1994

OTHER PUBLICATIONS

Carter et al., "22nm FDSOI Technology for Emerging Mobile, Internet-of-Things, and RF Applications", IEEE International Electron Devices Meeting (IEDM), 2016, pp. 1-4.
(Continued)

*Primary Examiner* — Natalia A Gondarenko
(74) *Attorney, Agent, or Firm* — Francois Pagette; Hoffman Warnick LLC

(57) ABSTRACT

Disclosed is a semiconductor structure including at least one bipolar junction transistor (BJT), which is uniquely configured so that fabrication of the BJT can be readily integrated with fabrication of complementary metal oxide semiconductor (CMOS) devices on an advanced silicon-on-insulator (SOI) wafer. The BJT has an emitter, a base, and a collector laid out horizontally across an insulator layer and physically separated. Extension regions extend laterally between the emitter and the base and between the base and the collector and are doped to provide junctions between the emitter and the base and between the base and the collector. Gate structures are on the extension regions. The emitter, base, and collector are contacted. Optionally, the gate structures and a substrate below the insulator layer are contacted and can be biased to optimize BJT performance. Optionally, the structure further includes one or more CMOS devices. Also disclosed is a method of forming the structure.

20 Claims, 8 Drawing Sheets

(51) Int. Cl.
*H01L 29/78* (2006.01)
*H01L 21/84* (2006.01)
*H01L 21/8238* (2006.01)
*H01L 21/768* (2006.01)
*H01L 29/735* (2006.01)
*H01L 29/739* (2006.01)
*H01L 29/66* (2006.01)
*H01L 29/08* (2006.01)
*H01L 29/10* (2006.01)

(52) U.S. Cl.
CPC ...... *H01L 29/0808* (2013.01); *H01L 29/0821* (2013.01); *H01L 29/10* (2013.01); *H01L 29/1008* (2013.01); *H01L 29/6625* (2013.01); *H01L 29/66325* (2013.01); *H01L 29/7394* (2013.01)

(58) Field of Classification Search
CPC ............. H01L 29/0821; H01L 29/0808; H01L 29/0804; H01L 29/0878; H01L 29/0882; H01L 29/1004; H01L 29/1008; H01L 29/1095; H01L 29/41708; H01L 29/42304; H01L 29/735; H01L 29/737; H01L 29/66318; H01L 29/66174; H01L 29/66189; H01L 29/6625; H01L 29/66242; H01L 29/66234–66348; H01L 29/73–7378; H01L 29/739–7398; H01L 21/041; H01L 21/0415; H01L 21/265; H01L 21/26506; H01L 21/2652; H01L 21/76; H01L 21/76283; H01L 2924/1305–13056; H01L 27/1207; H01L 27/1022; H01L 27/0722; H01L 27/0623; H01L 27/0635; H01L 27/0647; H01L 27/0652; H01L 27/0658; H01L 29/66325; H01L 29/7394; H01L 27/067; H01L 27/082; H01L 27/0928; H01L 27/1203; H01L 21/84; H01L 21/8248
USPC ....... 257/197, 198, 369, 21.35, 21.352, 350; 438/309, 141, 189, 318, 331, 350, 257
See application file for complete search history.

(56) References Cited

U.S. PATENT DOCUMENTS

| | | | |
|---|---|---|---|
| 6,972,466 B1* | 12/2005 | Liang | H01L 29/735 257/376 |
| 8,441,084 B2 | 5/2013 | Cai et al. | |
| 10,014,397 B1 | 7/2018 | Jain et al. | |
| 2006/0060941 A1 | 3/2006 | Sun et al. | |
| 2007/0105301 A1* | 5/2007 | Chen | H01L 29/735 438/234 |
| 2010/0213575 A1* | 8/2010 | Chen | H01L 27/0203 257/575 |
| 2014/0175528 A1* | 6/2014 | Zieren | G01R 33/066 257/295 |
| 2015/0287740 A1* | 10/2015 | Bedell | H01L 29/7849 438/154 |
| 2020/0027846 A1 | 1/2020 | Chen et al. | |

OTHER PUBLICATIONS

Cheng et al., "Fully Depleted SOI (FDSOI) Technology", Science China Press and Springer, vol. 59, 2016, pp. 1-15.

Chew et al., "RF Performance of 28nm PolySiON and HKMG CMOS Devices", Research Gate 2015, pp. 1-5.

* cited by examiner

LATERAL BIPOLAR JUNCTION TRANSISTOR AND METHOD

BACKGROUND

Field of the Invention

The present invention relates to bipolar junction transistors (BJT) and, more particularly, to embodiments of semiconductor structure including a lateral BJT and embodiments of a method of forming the semiconductor structure.

Description of Related Art

Advantages associated with manufacturing complementary metal oxide semiconductor (CMOS) designs using advanced silicon-on-insulator (SOI) processing technology platforms (e.g., a fully-depleted silicon-on-insulator (FD-SOI) processing technology platform) include, for example, reduced power, reduced area consumption, reduced cost, high performance, multiple core threshold voltage (Vt) options, etc. CMOS designs manufactured on advanced SOI wafers are used in a variety of applications including, but not limited to, Internet-of-Things (IOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). Conventional BJTs are typically formed as vertical devices (e.g., with an in-substrate collector, a base aligned above the collector, and an emitter aligned above the base). As a result, integration of current state-of-the-art BJT and FET processing using advanced SOI processing technology platforms can be complex and expensive.

SUMMARY

In view of the foregoing, disclosed herein are embodiments of semiconductor structure that includes at least one bipolar junction transistor (BJT), which is uniquely configured so that fabrication of the BJT can be readily and inexpensively integrated with fabrication of complementary metal oxide semiconductor (CMOS) devices on an advanced silicon-on-insulator (SOI) wafer (e.g., a fully-depleted silicon-on-insulator (FDSOI) wafer). The BJT can be a lateral BJT with an emitter, a base, and a collector laid out horizontally across an insulator layer (as opposed to being stacked vertically) and further physically separated from each other. Extension regions can extend laterally between the emitter and the base and between the base and the collector and can be doped to provide junctions between the emitter and the base and between the base and the collector. Gate structures can be aligned above and in contact with the extension regions. The emitter, the base, and the collector can be contacted. Optionally, the gate structures and/or the substrate can also be contacted, thereby creating a BJT with three primary terminals and one or more secondary terminals. During BJT operation, the secondary terminal(s) can be biased in addition to the primary terminals in order to optimize BJT performance. Optionally, the semiconductor structure can further include one or more CMOS devices (e.g., one or more field effect transistor(s) (FET(s)). Also disclosed herein are embodiments of a method of forming the above-described semiconductor structure embodiments.

More particularly, disclosed herein are embodiments of semiconductor structure. The semiconductor structure can include a semiconductor layer. The semiconductor structure can further include at least one bipolar junction transistor (BJT). The BJT can include an emitter, a base, and a collector laid out horizontally (as opposed to being stacked vertically) and further physically separated from each other. The BJT can also include two extension regions. A first extension region can be in the semiconductor layer extending laterally between the emitter and the base. A second extension region can be in the semiconductor layer extending laterally between the base and the collector. The first extension region and the second extension region can be doped, as described further in the detailed description section of this specification, in such a way as to provide the necessary junctions between the emitter and the base and between the base and the collector for BJT functionality. The BJT can further include a first gate structure on the first extension region and a second gate structure on the second extension region. Fabrication of a BJT with the above-described structure can readily and inexpensively be integrated with fabrication of complementary metal oxide semiconductor (CMOS) devices on an advanced silicon-on-insulator (SOI) wafer (e.g., a fully-depleted silicon-on-insulator (FDSOI) wafer). Thus, in some embodiments, the semiconductor structure can further include one or more CMOS devices and, more particularly, at least one field effect transistor (FET). The FET can include: source/drain regions, a channel region in the semiconductor layer extending laterally between the source/drain regions, and an additional gate structure on the channel region.

Also disclosed herein are embodiments of a method of forming the above-described semiconductor structure. The method embodiments can include providing a semiconductor layer. The method embodiments can further include forming gate structures on the semiconductor layer. The method embodiments can further include forming one or more devices using the semiconductor layer and the gate structures. Specifically, the method embodiments can include forming at least one bipolar junction transistor (BJT) using the semiconductor layer and two of the gate structures. The BJT can be formed such that it includes an emitter, a base, and a collector laid out horizontally (as opposed to being stacked vertically) and further physically separated from each other. The BJT can further be formed such that it includes two extension regions: a first extension region, which is in the semiconductor layer extending laterally between the emitter and the base and which is doped so as to provide a junction between the emitter and the base; and a second extension region, which is in the semiconductor layer extending laterally between the base and the collector and which is doped so as to provide a junction between the base and the collector. The BJT can further be formed such that it includes a first gate structure on the first extension region and a second gate structure on the second extension region. Fabrication of a BJT as described above can readily and inexpensively be integrated with fabrication of complementary metal oxide semiconductor (CMOS) devices on an advanced silicon-on-insulator (SOI) wafer (e.g., a fully-depleted silicon-on-insulator (FDSOI) wafer). Thus, some method embodiments can further include, as the BJT is being formed, concurrently forming one or more CMOS devices and more particularly, concurrently forming at least one field effect transistor (FET). The FET can be formed so that it includes source/drain regions, a channel region in the semiconductor layer extending laterally between source/drain regions, and an additional gate structure on the channel region.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, advantages associated with manufacturing complementary metal oxide semiconductor (CMOS) designs using advanced silicon-on-insulator (SOI) processing technology platforms (e.g., a fully-depleted silicon-on-insulator (FDSOI) processing technology platform) include, for example, reduced power, reduced area consumption, reduced cost, high performance, multiple core threshold voltage (Vt) options, etc. CMOS designs manufactured on advanced SOI wafers are used in a variety of applications including, but not limited to, Internet-of-Things (IOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). Conventional BJTs are typically formed as vertical devices (e.g., with an in-substrate collector, a base aligned above the collector, and an emitter aligned above the base). As a result, integration of current state-of-the-art BJT and FET processing using advanced SOI processing technology platforms can be complex and expensive.

In view of the foregoing, disclosed herein are embodiments of semiconductor structure that includes at least one bipolar junction transistor (BJT), which is uniquely configured so that fabrication of the BJT can be readily and inexpensively integrated with fabrication of complementary metal oxide semiconductor (CMOS) devices on an advanced silicon-on-insulator (SOI) wafer (e.g., a fully-depleted silicon-on-insulator (FDSOI) wafer). The BJT can be a lateral BJT with an emitter, a base, and a collector laid out horizontally across an insulator layer (as opposed to being stacked vertically) and further physically separated from each other. Extension regions can extend laterally between the emitter and the base and between the base and the collector and can be doped to provide junctions between the emitter and the base and between the base and the collector. Gate structures can be aligned above and in contact with the extension regions. The emitter, the base, and the collector can be contacted. Optionally, the gate structures and/or the substrate can also be contacted, thereby creating a BJT with three primary terminals and one or more secondary terminals. During BJT operation, the secondary terminal(s) can be biased in addition to the primary terminals in order to optimize BJT performance. Optionally, the semiconductor structure can further include one or more CMOS devices (e.g., one or more field effect transistor(s) (FET(s)). Also disclosed herein are embodiments of a method of forming the above-described semiconductor structure embodiments.

Figure 1:
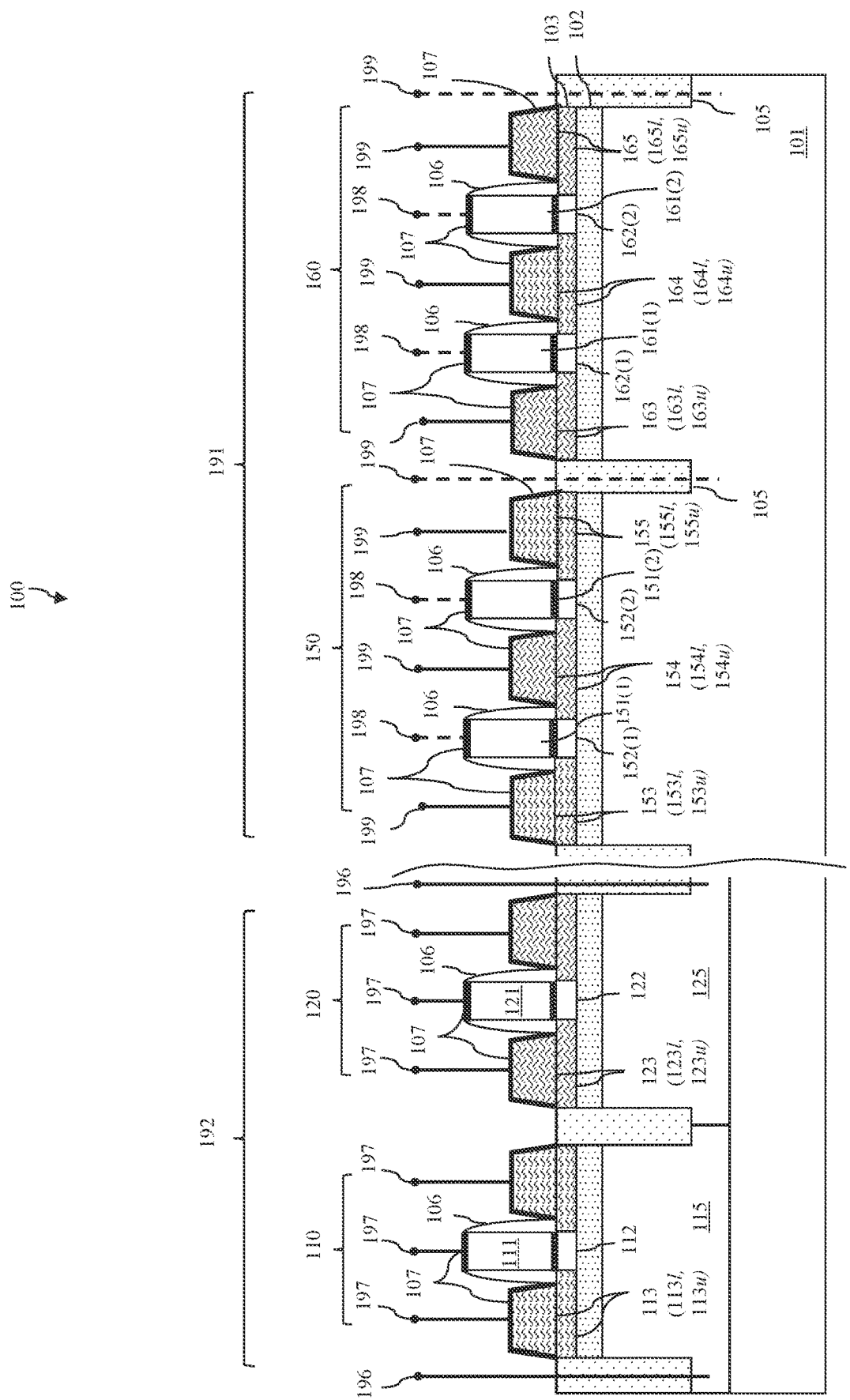
FIG. 1 is a cross-section diagram illustrating disclosed embodiments of a semiconductor structure.

More particularly, referring to FIG. 1, disclosed herein are embodiments of a semiconductor structure 100. The semiconductor structure 100 can include a semiconductor layer 103. In some embodiments, the semiconductor structure 100 can include a semiconductor substrate 101, an insulator layer 102 on the semiconductor substrate 101, and the semiconductor layer 103 on the insulator layer 102. In some embodiments, the semiconductor structure 100 can be a silicon-on-insulator (SOI) structure in which the semiconductor layer 103 is a silicon layer, the insulator layer 102 is a buried oxide (BOX) layer or some other suitable insulator layer, and the semiconductor substrate 101 is a silicon substrate. In some embodiments, this SOI structure can be an advanced SOI structure (e.g., a fully-depleted silicon-on-insulator (FDSOI) structure).

The semiconductor structure 100 can further include a bipolar junction transistor (BJT) area 191 with one or more lateral bipolar junction transistors (BJTs) (e.g., see NPN-type BJT 150 and PNP-type BJT 160). Optionally, the semiconductor structure 100 can also include a field effect transistor (FET) area 192 with one or more field effect transistors (FETs) (e.g., see N-type FET (NFET) 110 and P-type FET (PFET) 120).

In the BJT area 191, each BJT 150, 160 can include an emitter 153, 163, a collector 155, 165 and a base 154, 164 positioned laterally between the emitter 153, 163 and the collector 155, 165. The base 154, 164 can have a first type conductivity and the emitter 153, 163 and collector 155, 165 can each have a second type conductivity that is different for the first type conductivity. Specifically, for an NPN-type BJT 150, the base 154 can have P-type conductivity at a relatively high conductivity level (i.e., the base 154 can be a P+ region) and the emitter 153 and the collector 155 can each have N-type conductivity at relatively high conductivity levels (i.e., the emitter 153 and the collector 155 can be N+ regions). Alternatively, for a PNP-type BJT 160, the base 164 can have N-type conductivity at a relatively high conductivity level (i.e., the base 164 can be an N+ region) and the emitter 163 and the collector 165 can have P-type conductivity at relatively high conductivity levels (i.e., the emitter 163 and the collector 165 can be P+ regions).

In any case, in each BJT 150, 160, the emitter 153, 163, the base 154, 164 and the collector 155, 165 can be laid out horizontally across the insulator layer 102 (as opposed to being stacked vertically). The emitter 153, 163 can include a lower emitter portion 153*l*, 163*l* that is within the semiconductor layer 103. Optionally, the emitter 153, 163 can further include an upper emitter portion 153*u*, 163*u* on the lower emitter portion 153*l*, 163*l*. The upper emitter portion 153*u*, 163*u* can specifically be a raised epitaxial emitter layer. That is, it can be an epitaxial semiconductor layer (e.g., an epitaxial silicon layer) formed on the lower emitter portion of the semiconductor layer. The base 154, 164 can include a lower base portion 154*l*, 164*l* that is in the semiconductor layer 103. Optionally, the base 154, 164 can further include an upper base portion 154*u*, 164*u* on the lower base portion. The upper base portion 154*u*, 164*u* can specifically be a raised epitaxial base layer. That is, it can be an epitaxial semiconductor layer (e.g., an epitaxial silicon layer) formed on the lower base portion 154*l*, 164*l* of the semiconductor layer 103. The collector 155, 165 can include a lower collector portion 155*l*, 165*l* that is in the semiconductor layer 103. Optionally, the collector 155, 165 can include an upper collector portion 155*u*, 165*u* on the lower collector portion. The upper collector portion 155u, 165u can specifically be a raised epitaxial collector layer. That is, it can be an epitaxial semiconductor layer (e.g., an epitaxial silicon layer) formed on the lower collector portion 155l, 165l of the semiconductor layer 103. Optionally, metal silicide layers 107 can cover the top surfaces of emitter 153, 163, base 154, 164 and collector 155, 165 of each BJT 150, 160. The metal silicide layers 107 can be, for example, layers of cobalt silicide (CoSi), nickel silicide (NiSi), tungsten silicide (WSi), titanium silicide (TiSi), or any other suitable metal silicide material.

The above-mentioned upper portions (if present) and lower portions of the base, emitter, and collector of each BJT 150, 160 can be doped, during processing, so as to have the appropriate conductivity type and level depending on whether the BJT is an NPN-type BJT or a PNP-type BJT. For example, as discussed in greater detail below with regard to the method embodiments, upper portions of the base, emitter, and collector of each BJT can be in-situ doped during epitaxial deposition. Furthermore, an anneal process can be performed following epitaxial deposition so as to drive dopant material from the epitaxial semiconductor layers into the portions of the semiconductor layer 103 below, thereby ensuring that the lower portions of the base, emitter, and collector have the same conductivity type as the upper portions. Alternatively, lower portions of the base, emitter, and collector of each BJT 150, 160 can be doped via dopant implantation.

In any case, within each BJT 150, 160, the emitter 153, 163, the base 154, 164, and the collector 155, 165 can be physically separated from each other. The space between the emitter 153, 163 and the base 154, 164 can include: a first extension region 152(1), 162(1), which is within the semiconductor layer 103 and which extends laterally between the lower emitter portion 153l, 163l and the lower base portion 154l, 164l; and a first gate structure 151(1), 161(1), which is on the top surface of the semiconductor layer 103 at the first extension region 152(1), 162(1). The space between the base 154, 164 and the collector 155, 165 can include: a second extension region 152(2), 162(2), which is within the semiconductor layer 103 and which extends laterally between lower base portion 154l, 164l and the lower collector portion 155l, 165l; and a second gate structure 151(2), 161(2) on the top surface of the semiconductor layer 103 at the second extension region 152(2), 162(2).

The first extension region 152(1), 162(1) can be doped so as to provide a junction between the emitter 153, 163 and the base 154, 164. For example, the first extension region 152(1), 162(1) can be a base extension region (i.e., an extension of the base), which is doped so as to have the same type conductivity as the base 154, 164 at essentially the same conductivity level or at a lesser conductivity level. In this case, the resulting emitter-base junction is located at the interface between the lower emitter portion 153l, 163l and the first extension region 152(1), 162(1). Alternatively, the first extension region 152(1), 162(1) can be an emitter extension region (i.e., an extension of the emitter), which is doped so as to have the same type conductivity as the emitter 153, 163 at essentially the same conductivity level or at a lesser conductivity level. In this case, the resulting emitter-base junction is located at the interface between the first extension region 152(1), 162(1) and the lower base portion 154l, 164l.

Similarly, the second extension region 152(2), 162(2) can be doped so as to provide a junction between the base 154, 164 and the collector 155, 165. For example, the second extension region 152(2), 162(2) can be a base extension region, which is doped so as to have the same type conductivity as the base 154, 164 at essentially the same conductivity level or at a lesser conductivity level. In this case, the resulting base-collector junction is located at the interface between the second extension region 152(2), 162(2) and the lower collector portion 155l, 165l. Alternatively, the second extension region 152(2), 162(2) can be a collector extension region (i.e., an extension of the collector), which is doped so as to have the same type conductivity as the collector 155, 165 at essentially the same conductivity level or at a lesser conductivity level. In this case, the resulting base-collector junction is located at the interface between the lower base portion 154l, 164l and the second extension region 152(2), 162(2).

For example, consider the BJT 150 that is an NPN-type BJT. In some embodiments, the first extension region 152(1) and the second extension region 152(2) can both have P-type conductivity such that they are both base extension regions. In this case, the first extension region 152(1), the second extension region 152(2) and the base 154 could all have essentially the same conductivity level or different conductivity levels. That is, as mentioned above, the base 154 can be a P+ base region. The first extension region 152(1) could be a P+, P or P− extension region and the second extension region 152(2) could be a P+, P or P− extension region. In one exemplary embodiment, the first extension region 152(1) and the second extension region 152(2) can both be P− extension regions. In other embodiments, the first extension region 152(1) and the second extension region 152(2) can both have N-type conductivity such that they are an emitter extension region and a collector extension region, respectively. In this case, the first extension region 152(1) and the second extension region 152(2) could have essentially the same conductivity levels or different conductivity levels. That is, the first extension region 152(1) could be a N+, N or N− region and the second extension region 152(2) could be a N+, N or N− region. In one exemplary embodiment, the first extension region 152(1) can be an N+ extension region and the second extension region 152(2) can be an N− extension region.

Alternatively, consider the BJT 160 that is a PNP-type BJT. In some embodiments, the first extension region 162(1) and the second extension region 162(2) can both have N-type conductivity such that they are both base extension regions. In this case, the first extension region 162(1), the second extension region 162(2) and the base 164 could all have essentially the same conductivity level or different conductivity levels. That is, as mentioned above, the base 164 can be an N+ base region. The first extension region 162(1) could be a N+, N or N− extension region and the second extension region 162(2) could be a N+, N or N− extension region. In other embodiments, the first extension region 162(1) and the second extension region 162(2) can both have P-type conductivity such that they are an emitter extension region and a collector extension region, respectively. In this case, the first extension region 162(1) and the second extension region 162(2) could have essentially the same conductivity levels or different conductivity levels. That is, the first extension region 162(1) could be a P+, P or P− region and the second extension region 162(2) could be a P+, P or P− region.

In any case, the first gate structure 151(1), 161(1) and the second gate structure 151(2), 161(2) can be configured in essentially the same manner as gate structures of FETs in the FET area 192 (if present). Generally, the first gate structure 151(1), 161(1) and the second gate structure 151(2), 161(2) can each include a gate stack. The gate stack can be a gate-first polysilicon gate stack, which includes, for example: a silicon dioxide gate dielectric layer on the semiconductor layer 103; a doped polysilicon gate conductor layer on the silicon dioxide gate dielectric layer; and, optionally, a metal silicide layer 107 (e.g., CoSi, NiSi, WSi, TiSi, or any other suitable metal silicide material layer) on the doped polysilicon gate conductor layer. Alternatively, the gate stack could be a gate-first high-K metal gate (HKMG) stack, which includes, for example: an interfacial layer (e.g., a silicon oxynitride layer) on the semiconductor layer 103; a high-K gate dielectric layer (i.e., a layer of dielectric material with a dielectric constant that is greater than 3.9 including, for example, hafnium (HO-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer 107, as discussed above, on the doped polysilicon gate conductor layer. Alternatively, the gate stack can be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer 107, as discussed above, on the doped polysilicon gate conductor layer.

Those skilled in the art will recognize that, optionally, the gate structures of FETs with different type conductivities can vary to achieve different effective work functions (e.g., as discussed in greater detail below with regard to the PFET and NFET structures). Similarly, in some embodiments disclosed herein, the gate structures of the NPN-type BJT and the PNP-type BJT can vary. For example, the gate structures on P-type base extensions of an NPN-type BJT could optionally be configured in essentially the same manner as the gate structure on the channel region of the NFET (e.g., they could include an N-doped polysilicon gate conductor layer in the case of a gate-first polysilicon gate stack or an N-type work function metal layer in the case of a gate-first HKMG or RMG gate stack, as discussed in greater detail below with regard to the gate stack structure of the NFET). Similarly, the gate structures on N-type base extensions of a PNP-type BJT could optionally be configured in essentially the same manner as the gate structure on the channel region of the PFET (e.g., they could include a P-doped polysilicon gate conductor layer in the case of a gate-first polysilicon gate stack or a P-type work function metal layer in the case of a gate-first HKMG or RMG gate stack, as discussed in greater detail below with regard to the gate stack structure of the PFET). These exemplary BJT gate structures are provided for illustration purposes and are not intended to be limiting. Different BJT gate structures could be employed, for example, in embodiments where the gate structures are sitting on an emitter extension and a collector extension, respectively, instead of on base extensions. Furthermore, the two gate structures in a given BJT could optionally be different to achieve optimal performance, for example, in an asymmetrical device where the gate structures are sitting on a base extension and on either an emitter extension or a collector extension, respectively; in a high voltage device with a partially depleted collector; etc.

In any case, gate sidewalls spacers 106 can be positioned laterally adjacent to the sidewalls of the gate structures. The gate sidewall spacers 106 can be made of any suitable dielectric gate sidewall spacer material (e.g., silicon dioxide, silicon oxynitride, silicon nitride or any other suitable dielectric gate sidewall spacer material). The gate sidewall spacers 106 on the first gate structure 151(1), 161(1) can electrically isolate the first gate structure 151(1), 161(1) from the emitter 153, 163 and base 154, 164. Similarly, the gate sidewall spacers 106 on the second gate structure 151(2), 161(2) can electrically isolate the second gate structure 151(2), 161(2) from the base 154, 164 and the collector 155, 165.

In each BJT 150, 160, the emitter 153, 163, the base 154, 164 and the collector 155, 165 can be contacted (e.g., by conventional middle of the line (MOL) contacts). Optionally, the first gate structure 151(1), 161(1), the second gate structure 151(2), 161(2), and/or the semiconductor substrate 101 can also be contacted (e.g., by conventional middle of the line (MOL) contacts), thereby creating a BJT 150, 160 with three primary terminals 199 and 1-3 secondary terminals 198. During BJT operation, the secondary terminal(s) 198 can be selectively biased in addition to the primary terminals 199 in order to modulate DC characteristics and, thereby optimize BJT performance.

As mentioned above, the semiconductor structure 100 can, optionally, also include FET area 192 with one or more field effect transistors (FETs) and, particularly, an N-type field effect transistor (NFET) 110 and a p-type field effect transistor (PFET) 120. These FETs can be regular threshold voltage (RVT) or high threshold voltage (HVT) n-type and p-type field effect transistors or super low threshold voltage (SLVT) or low threshold voltage (LVT) n-type and p-type field effect transistors. Optionally, the FET area 192 can include a combination of both RVT or HVT n-type and p-type FETs and SLVT or LVT n-type and p-type FETs. Those skilled in the art will recognize that FETs with different threshold voltage levels (e.g., RVTs, HVTs, LVTs, SLVTs, etc.) will be configured differently. For example, such FETs will have differences in channel doping, halo implants, gate lengths and/or differences in any other parameter that alone or in combination with differences in other parameters can impact threshold voltage).

In any case, each NFET 110 can include, for example, an intrinsic (i.e., undoped) or P− channel region 112 in the semiconductor layer 103 extending laterally between N+ source/drain regions 113. Each N+ source/drain region 113 can include, for example, a lower source/drain portion 113*l* within the semiconductor layer 103 and, optionally, an upper source/drain portion 113*u* (also referred to herein as a raised epitaxial source/drain portion) above the lower source/drain portion. Each NFET 110 can further include a gate structure 111 on the channel region 112. Gate sidewalls spacers 106 can be positioned laterally adjacent to the sidewalls of the gate structure 111 and can electrically isolate the gate structure 111 from the source/drain regions 113. Each NFET 110 can further include a well region 115 in the semiconductor substrate 101 aligned below the channel region 112 and source/drain regions 113. For an RVT or HVT NFET, the well region 115 can be a P-well. For a SLVT or LVT NFET, the well region 115 can be an N-well.

Each PFET 120 can include an intrinsic (i.e., undoped) or N− channel region 122 in the semiconductor layer 103 extending laterally between P+ source/drain regions 123. Each P+ source/drain region 123 can include, for example, a lower source/drain portion 123*l* within the semiconductor layer 103 and, optionally, an upper source/drain portion 123u (also referred to herein as a raised epitaxial source/drain portion) above the lower source/drain portion. Each PFET 120 can further include a gate structure 121 on the channel region 122. Gate sidewalls spacers 106 can be positioned laterally adjacent to the sidewalls of the gate structure 121 and can electrically isolate the gate structure from the source/drain regions 123. Each PFET 120 can further include a well region 125 in the semiconductor substrate 101 aligned below the channel region 122 and source/drain regions 123. For a SLVT or LVT PFET, the well region 125 can be a P-well. For a RVT or HVT PFET, the well region 125 can be an N-well.

It should be noted that the gate structures 111 and 121 can each include a gate stack. The gate stack can be a gate-first polysilicon gate stack, which includes, for example: a silicon dioxide gate dielectric layer; a doped polysilicon gate conductor layer on the silicon dioxide gate dielectric layer; and, optionally, a metal silicide layer 107 (e.g., CoSi, NiSi, WSi, TiSi, or any other suitable metal silicide material layer) on the doped polysilicon gate conductor layer. Alternatively, the gate stack could be a gate-first high-K metal gate (HKMG) stack, which includes, for example: an interfacial layer (e.g., a silicon oxynitride layer) on the semiconductor layer 103; a high-K gate dielectric layer (i.e., a layer of dielectric material with a dielectric constant that is greater than 3.9 including, for example, hafnium (HO-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer 107, as discussed above, on the doped polysilicon gate conductor layer. Alternatively, the gate stack be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer 107, as discussed above, on the doped polysilicon gate conductor layer.

Various different gate-first and replacement metal gate structures are known in the art and, thus, the details of such gate structures have been omitted from this specification in order to allow the reader to focus on the salient aspects of the disclosed embodiments. However, as discussed above, those skilled in the art will recognize that the configuration of the gate stack of the gate structure 111 of an NFET 110 and the configuration of the gate stack of the gate structure 121 of a PFET 120 can, optionally, be different so that these gate structures 111 and 121 have different effective work functions in order to optimize NFET 110 and PFET 120 performance. Specifically, those skilled in the art will recognize that the optimal effective work function for the gate structure of a PFET is, for example, between about 4.9 eV and about 5.2 eV, whereas the optimal effective work function for the gate structure of an NFET is, for example, between 3.9 eV and about 4.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)).

In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation.

In an RMG, the desired effective work function can be achieved, for example, using different work function metal layers immediately adjacent to the high-K gate dielectric layer. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide.

In any case, in each FET 110, 120, the source/drain regions 113, 123 and the gate structure 111, 121 can be contacted (e.g., by conventional middle of the line (MOL) contacts). Optionally, the well region 115, 125 can also be contacted (e.g., by conventional middle of the line (MOL) contacts), thereby creating a FET 110, 120 with three primary terminals 197 and a secondary terminal 196. During FET operation, the secondary terminal 196 can be selectively biased in addition to the primary terminals 197 in order to modulate the threshold voltage (Vt) of the particular FET.

The semiconductor structure 100 can further include trench isolation regions 105. Each trench isolation region can include, for example, a trench, which extends vertically through the semiconductor layer 103 to the insulator layer 102, which, optionally, further extends through insulator layer 102 into the semiconductor substrate 101, and which is filled with one or more layers of isolation material (e.g., silicon dioxide or other suitable isolation material). Such trench isolation regions 105 can electrically isolate the different device areas 191-192 from each other and can further electrically isolate different devices within those areas.

It should be understood that the description and drawings of the disclosed semiconductor structure embodiments are provided for illustration purposes and are not intended to be limiting. Additional embodiments of the semiconductor structure could include additional and/or alternative features not discussed above, could be devoid of features discussed above, and/or could be formed using some different processing technology platforms than the processing technology platforms discussed above.

For example, in the NPN-type BJT 150, the lower emitter portion 153l, the first extension region 152(1), the lower base portion 154l, the second extension region 152(2), and the lower collector portion 155l of the BJT 150 are described above as being portions of a semiconductor layer such as a silicon layer. Furthermore, the upper emitter portion 153u, the upper base portion 154u, and the upper collector portion 155u of the NPN-type BJT 150 are described above as being epitaxial silicon layers. However, optionally, the semiconductor layer could be a hybrid semiconductor layer with different portions comprising different types of semiconductor materials (e.g., silicon and silicon germanium). With such a hybrid semiconductor layer, the NPN-type BJT 150 could be a heterojunction bipolar transistor (HBT). In this case, the emitter 153 (including the lower and upper emitter portions 153l-153u), the first extension region 152(1), and the collector 155 (including the lower and upper collector portions 155l-155u) could be silicon, whereas the base 154 (including the lower and upper base portions 154l-154u) and the second extension region 152(2) could be silicon germanium. Further, optionally, the second extension region 152(2) could have a greater concentration of germanium than the base 154. Those skilled in the art will recognize that an HBT is generally considered able to handle higher frequency operations than a BJT.

Also, for example, the semiconductor structure 100 is described above and illustrated in the drawings as including only planar devices. That is, the BJTs 150, 160 and FETs 110, 120 are all planar devices having gate structures that are only adjacent to the top surface of the semiconductor layer 103. However, alternative semiconductor structure embodiments could include non-planar devices, such as fin-type devices (e.g., where the semiconductor layer is patterned, for example, in the shape of a semiconductor fin and the gate structures are formed adjacent to the top surface and opposing sides of the semiconductor fin) or gate-all-around devices.

Finally, the semiconductor structure 100 is described above and illustrated in the drawings as being a semiconductor-on-insulator structure (e.g., an SOI structure, such as a FDSOI structure). However, an alternative semiconductor structure embodiment could be a bulk semiconductor structure where the semiconductor layer discussed above refers to an upper portion of a bulk semiconductor substrate (as opposed to a semiconductor layer on an insulator layer).

Also disclosed herein are embodiments of a method of forming a semiconductor structure such as the semiconductor structure 100, which is described in detail above, which is illustrated in FIG. 1, and which includes at least one bipolar junction transistor (BJT) (e.g., see the NPN-type BJT 150 and the PNP-type BJT 160) and, optionally, at least one field effect transistor (FET) (e.g., see the N-type FET (NFET) 110 and the P-type FET (PFET) 120). As discussed above with regard to the structure embodiments, each BJT 150, 160 in the semiconductor structure 100 is uniquely configured so that fabrication can be readily and inexpensively integrated with fabrication of complementary metal oxide semiconductor (CMOS) devices (e.g., the FETs 110, 120) on an advanced silicon-on-insulator (SOI) wafer (e.g., fully-depleted silicon-on-insulator (FDSOI) wafer). Therefore, for purposes of illustration, the method embodiments described below and illustrated in the drawings include concurrent fabrication, on an SOI wafer, of an NPN-type BJT 150 and a PNP-type BJT 160 in a BJT area 191 and an NFET 110 and a PFET 120 in a FET area 192.

Figure 2:
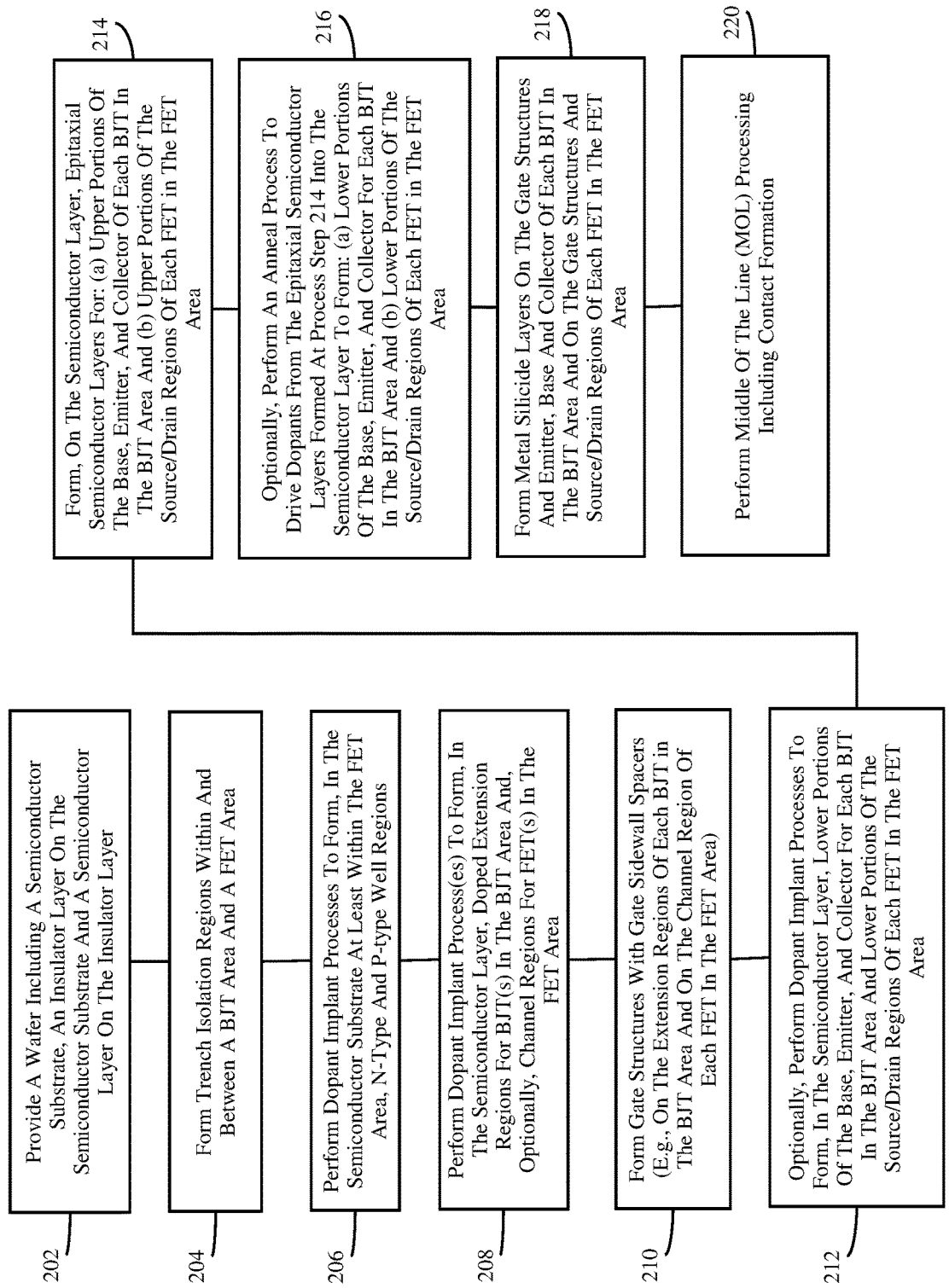
FIG. 2 is a flow diagram illustrating method embodiments for forming the semiconductor structure of FIG. 1.
Figure 3:
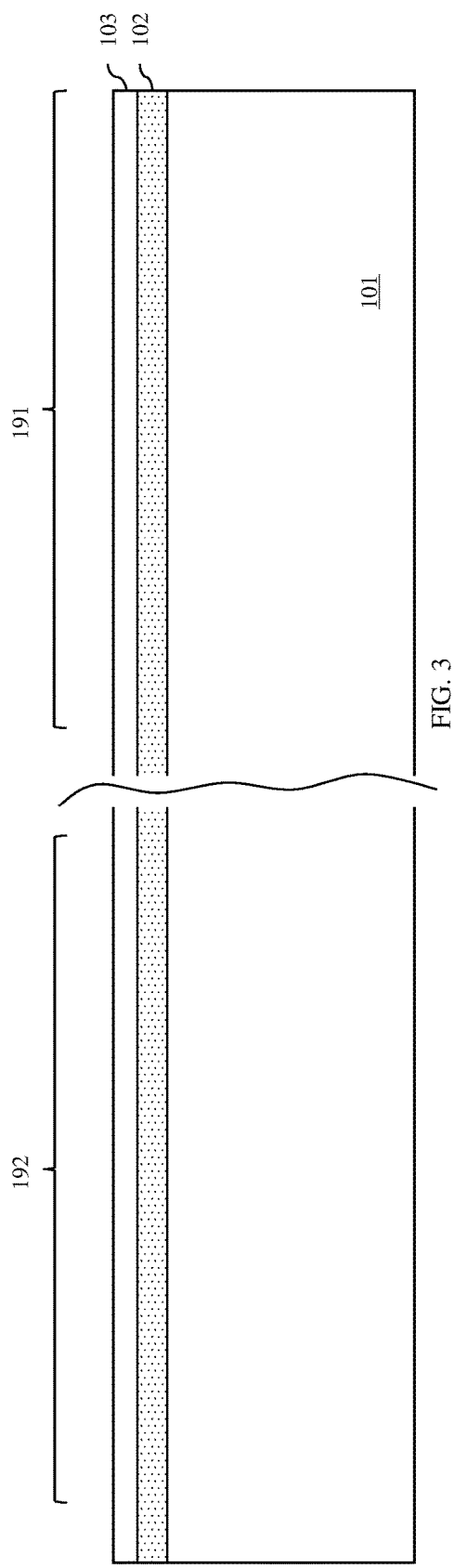
FIGS. 3-9 are cross-section diagrams illustrating partially completed semiconductor structures formed according to the flow diagram of FIG. 2.

More particularly, referring to the flow diagram of FIG. 2, the method embodiments can include providing a wafer (see process step 202 and FIG. 3). In some embodiments, the wafer can be a semiconductor-on-insulator wafer, which includes a semiconductor substrate 101, an insulator layer 102 on the semiconductor substrate 101, and a semiconductor layer 103 on the insulator layer. For example, the wafer could be a silicon-on-insulator (SOI) wafer, which includes a silicon substrate, a buried oxide (BOX) layer or some other suitable insulator layer on the silicon substrate, and a silicon layer on the BOX layer. In some embodiments, this SOI wafer can be an advanced SOI wafer (e.g., a fully-depleted silicon-on-insulator (FDSOI) wafer).

Figure 4:
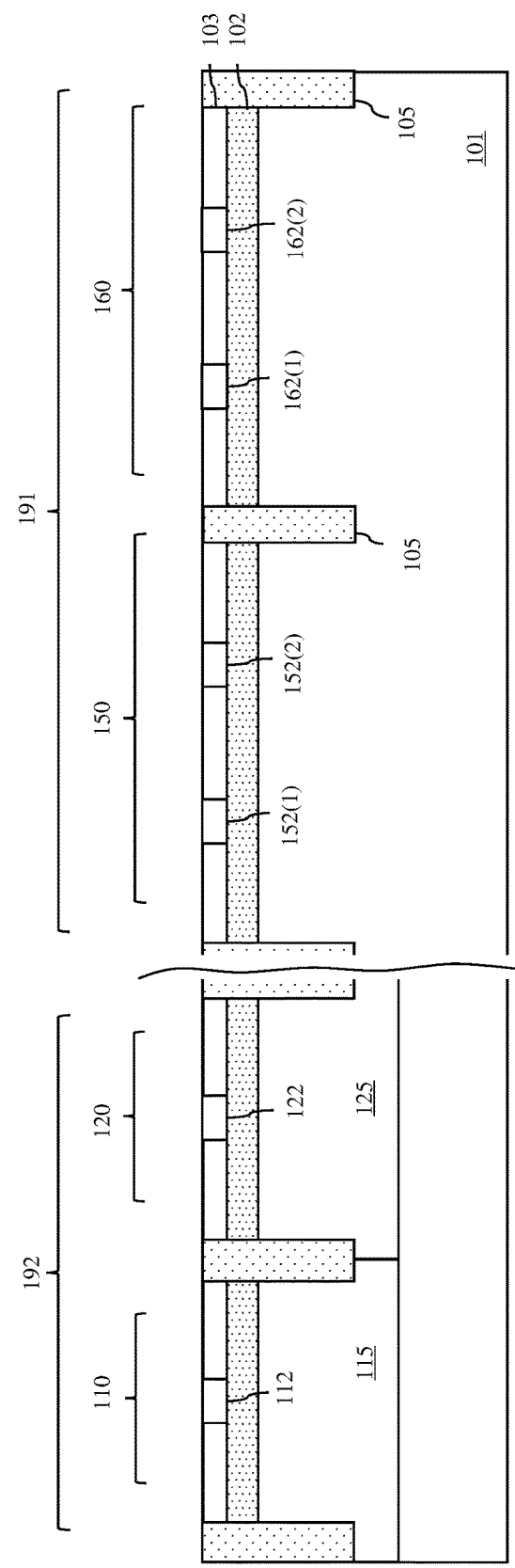

The method embodiments can include forming trench isolation regions 105 between and within different devices areas (e.g., a bipolar junction transistor (BJT) area 191 and a field effect transistor (FET) area 192) (see process step 204 and FIG. 4). For example, trenches can be formed (e.g., lithographically patterned and then etched) so that they extend essentially vertically through the semiconductor layer 103 and, optionally, through the insulator layer 102 and into the semiconductor substrate 101. The trenches can, for example, be patterned and etched so as to define the outer boundaries of the device areas 191-192 and so as to further define the active regions of the BJTs 150, 160 to be formed within the BJT area 191 and the active regions of the FETs 110, 120 to be formed within the FET area 192. Following trench formation, one or more layers of isolation material (e.g., silicon dioxide or some other suitable isolation material(s)) can be deposited so as to fill the trenches. Then, a polishing process (e.g., a chemical mechanical polishing (CMP) process) can be performed in order to remove the isolation material from the top surface of the semiconductor layer.

In addition to trench isolation region formation, various dopant implantation processes can be performed (see process steps 206-208 and FIG. 4).

Specifically, one or more dopant implant processes can be performed at process step 206 in order to form a well region 115 in the semiconductor substrate 101 aligned below the NFET area (i.e., the area on which the NFET 110 is to be formed) and a well region 125 in the semiconductor substrate 101 aligned below the PFET area (i.e., the area on which the PFET 120 is to be formed). The conductivity type of the well regions 115 and 125 will depend upon the threshold voltage types of the NFET 110 and PFET 120, respectively. For example, for an RVT or HVT NFET, the well region 115 can be a P-well, whereas, for an SLVT or LVT NFET, the well region 115 can be an N-well. For a SLVT or LVT PFET, the well region 125 can be a P-well, whereas, for a RVT or HVT PFET, the well region 125 can be an N-well. Thus, if the well regions 115, 125 require the same type conductivity, a single dopant implant process can be performed to concurrently form these well regions. If the well regions 115, 125 require different type conductivities, then the NFET area can be masked during the dopant implantation process to form the well region 125 and vice versa. In some embodiments, no well regions are formed in the semiconductor substrate 101 within the BJT area 191. Thus, it should be understood that the BJT area 191 would be masked during formation of the well regions 115 and 125.

Additional dopant implantation processes can be performed at process step 208 in order to ensure that different portions of the semiconductor layer 103 for the BJTs 150, 160 in BJT area 191 and, optionally, for the FETs 110, 120 within the FET area 192 are appropriately doped.

For example, as discussed above with regard to the structure embodiments, each BJT 150, 160 will have, within the semiconductor layer 103, a first extension region 152(1), 162(1), which will be positioned laterally between an emitter 153, 163 and a base 154, 164, and a second extension region 152(2), 162(2), which will be positioned laterally between the base 154, 164 and a collector 155, 165. The first and second extension regions 152(1)-152(2), 162(1)-162(2)

can be doped at process step 208 so that they function as either base extensions or emitter/collector extensions. Specifically, the first extension region 152(1), 162(1) can be doped so as to have the same type conductivity as the base 154, 164 at essentially the same conductivity level or at a lesser conductivity level and, thus, so as to function as a base extension region. Alternatively, the first extension region 152(1), 162(1) can be doped so as to have the same type conductivity as the emitter 153, 163 at essentially the same conductivity level or at a lesser conductivity level and, thus, so as to function as an emitter extension region. Similarly, the second extension region 152(2), 162(2) can be doped so as to have the same type conductivity as the base 154, 164 at essentially the same conductivity level or at a lesser conductivity level and, thus, so as to function as a base extension region. Alternatively, the second extension region 152(2), 162(2) can be doped so as to have the same type conductivity as the collector 155, 165 at essentially the same conductivity level or at a lesser conductivity level and, thus, so as to function as a collector extension region.

Also, as discussed above with regard to the structure embodiments, the NFET 110 will have a channel region 112 and the PFET 120 will have a channel region 122. In some embodiments, the channel regions 112, 122 can remain undoped. However, in other embodiments, the channel region 112 of the NFET 110 can be doped at process step 208 so as to have P-type conductivity at a relative low conductivity level (i.e., so that the channel region 112 is a P− channel region) and the channel region 122 of the PFET 120 can be doped at process step 208 so as to have N-type conductivity at a relative low conductivity level (i.e., so that the channel region 122 is a N− channel region).

Techniques for performing masked dopant implantation processes to form deep well and other dopant implant regions with different conductivity types and different conductivity levels are well known in the art. Thus, the details of such dopant implantation processes have been omitted from this specification in order to allow the reader to focus on the salient aspects of the disclosed method embodiments.

Figure 5:
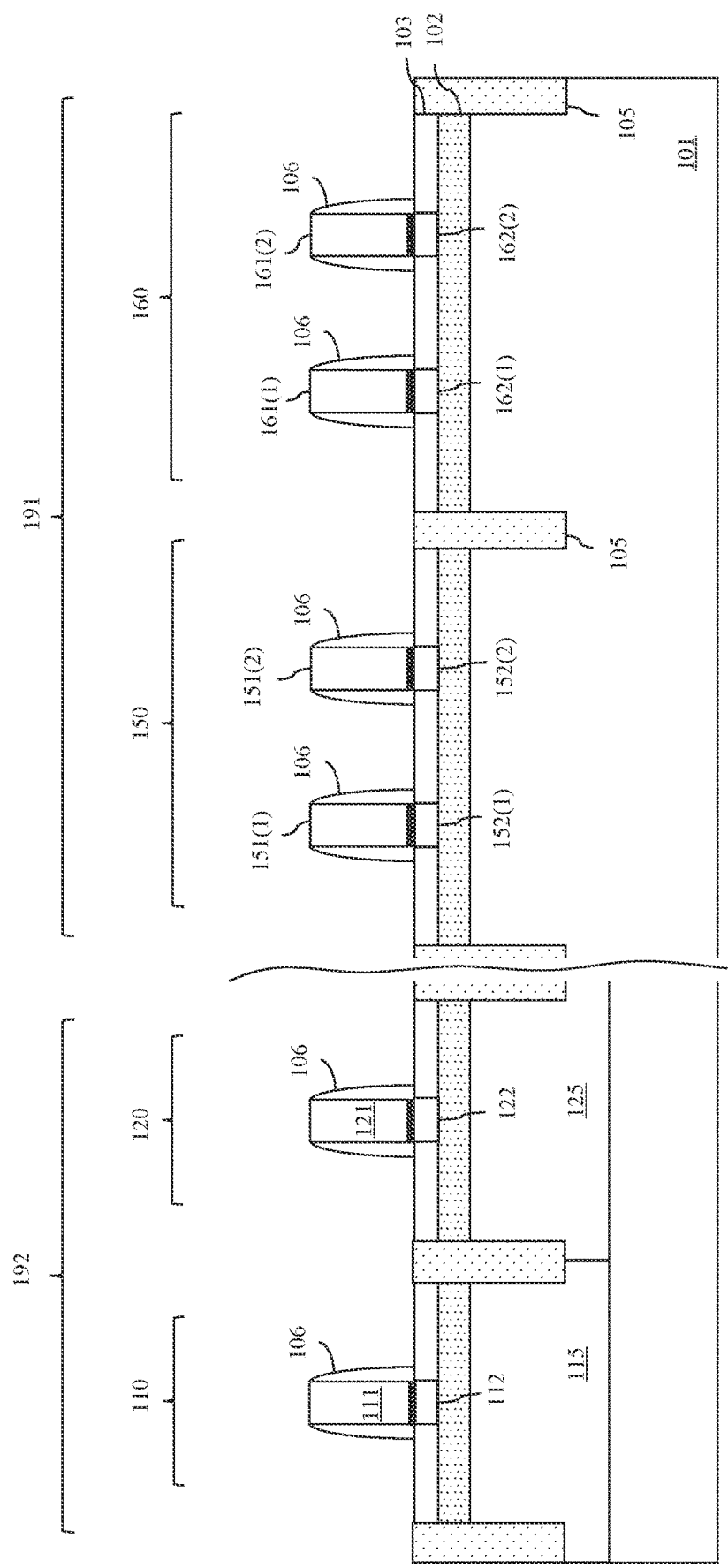

Gate structures can be concurrently formed in the different device areas 191-192 (see process step 210 and FIG. 5). Specifically, first and second gate structures 151(1)-151(2), 161(1)-161(2) can be formed in the BJT area 191 on the first and second extension regions 152(1)-152(2), 162(1)-162(2) of the BJTs 150, 160. Concurrently, additional gate structures 111, 121 can be formed in the FET area 192 on the channel regions 112, 122 of the FETs 110, 120.

Such gate structures can be formed, for example, using gate-first processing techniques. Gate-first processing can include, for example, deposition of multiple gate layers followed by lithographic patterning and etch processes to form discrete gate stacks, which in this case are on the semiconductor layer aligned above the first and second extension regions of each BJT and further above the channel region of each FET. The gate-first processing can be gate-first polysilicon gate processing, where the multiple gate layers can include, for example: a silicon dioxide gate dielectric layer on the semiconductor layer 103; and a doped polysilicon gate conductor layer on the silicon dioxide gate dielectric layer. Alternatively, the gate-first processing can be gate-first high-K metal gate (HKMG) processing where the multiple gate layers can include, for example: an interfacial layer (e.g., a silicon oxynitride layer) on the semiconductor layer 103; a high-K gate dielectric layer (i.e., a layer of dielectric material with a dielectric constant that is greater than 3.9 including, for example, hafnium (HO-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; stacked metal layers (e.g., a metal capping layer and an additional metal material layer suitable for dipole formation on the metal capping layer) on the high-K gate dielectric layer; and an optional doped polysilicon gate conductor layer on the metal gate conductor layer(s).

The gate structures for the NFET, PFET, NPN-type BJT and PNP-type BJT can be formed at process step 210 so that these devices have essentially the same gate structure or different gate structures. For example, in some embodiments, the gate structures for the NFET and PFET can be formed at process step 210 such that they are different from each other and, more particularly, such that they have different effective work functions, as discussed above with regard to the structure embodiments. Similarly, in some embodiments, the gate structures for the NPN-type BJT and the PNP-type BJT can be formed at process step 210 such that they are different from each other and, in some cases, such that they are essentially the same as the gate structures for the NFET and PFET, respectively. For example, in some embodiments, the gate structures on P-type base extensions of an NPN-type BJT could optionally be formed at process step 210 in essentially the same manner as and concurrently with the gate structure of the NFET and the gate structures on N-type base extensions of a PNP-type BJT could optionally be formed at process step 210 in essentially the same manner as and concurrently with the gate structure of the PFET. The embodiments described above are for illustration purposes and not intended to be limiting. It should be understood that the optimal gate structure formed at process step 210 for an NPN-type BJT or a PNP-type BJT can vary for a variety of reasons (e.g., if the gate structures are sitting on emitter and collector extensions (as opposed to base extensions); if the gate structures are sitting on a base extension and either an emitter extension or a collector extension; if the BJT is a high voltage device with a partially depleted collector; etc.). In any case, techniques for forming different gate stack structures (e.g., with different effective work functions) are well known in the art and, thus, the details have been omitted from the specification in order to allow the reader to focus on the salient aspects of the disclosed embodiments.

After the gate structures are formed, gate sidewall spacers 106 can be formed adjacent to the sidewalls of each gate structure 111, 121, 151(1), 151(2), 161(2), and 161(2). The gate sidewall spacers 106 can be formed, for example, using conventional gate sidewall spacer formation techniques. That is, a thin layer of dielectric gate sidewall spacer material (e.g., silicon dioxide, silicon oxynitride, silicon nitride or any other suitable dielectric gate sidewall spacer material) can be conformally deposited over the partially completed structure. Then, an anisotropic etch process can be performed in order to remove horizontal portions of the dielectric gate sidewall spacer material and leaving behind vertical portions (i.e., the gate sidewall spacers) positioned laterally adjacent to the sidewalls of the gate structures.

Optionally, additional dopant implantation processes can be performed in order to form, in the semiconductor layer 103, the lower portions of the emitter 153, 163, base 154, 164, and collector 155, 165 of each BJT 150, 160 in the BJT area 191 and the lower portions of the source/drain regions 113, 123 of each FET 110, 120 in the FET area 192 (see process step 212). For the NPN-type BJT 150, doping can be performed at process step 212 so that the portion of the base 154 within the semiconductor layer 103 has P-type conductivity at a relatively high conductivity level and so that the portions of the emitter 153 and the collector 155 within the semiconductor layer 103 have N-type conductivity at relatively high conductivity levels. For the PNP-type BJT 160, doping can be performed at process step 212 so that the portion of the base 164 within the semiconductor layer 103 has N-type conductivity at a relatively high conductivity level and so that the portions of the emitter 163 and the collector 165 within the semiconductor layer have P-type conductivity at relatively high conductivity levels. For the NFET 110, doping can be performed at process step 212 so that the portions of the source/drain regions 113 within the semiconductor layer 103 have N-type conductivity at the relatively high conductivity level. For PFET 120, doping can be performed at process step 212 so that the portions of the source/drain regions 123 within the semiconductor layer 103 have P-type conductivity at the relatively high conductivity level. It should be understood that any portions of the semiconductor layer that will have N+ conductivity (i.e., portions of the emitter and collector of the NPN-type BJT, a portion of the base of the PNP-type BJT and portions of the source/drain regions of the NFET) can be doped in the same dopant implantation process, while any portions of the semiconductor layer that will have P+ conductivity (i.e., portions of the emitter and collector of the PNP-type BJT, a portion of the base of the NPN-type BJT and portions of the source/drain regions of the PFET) are masked, and vice versa.

Figure 6:
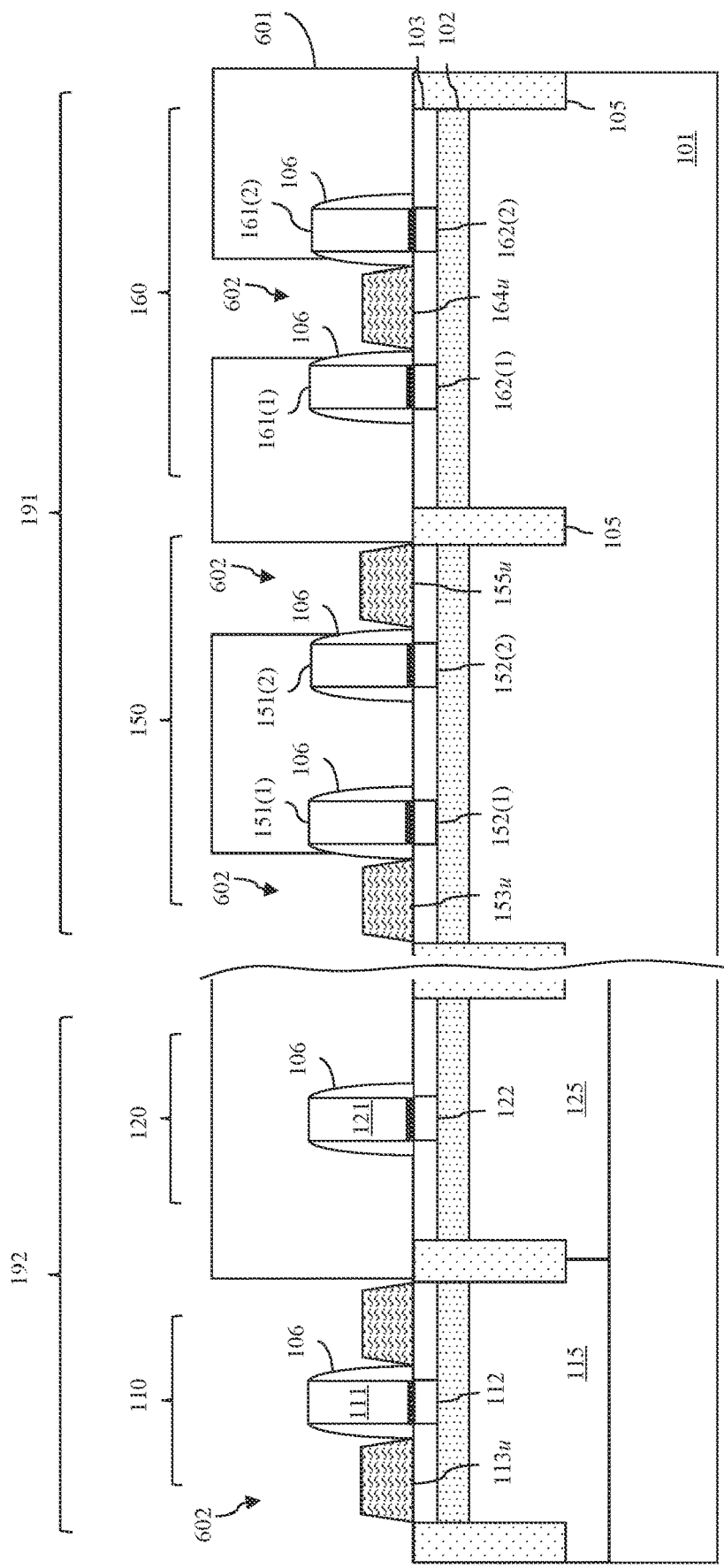
Figure 7:
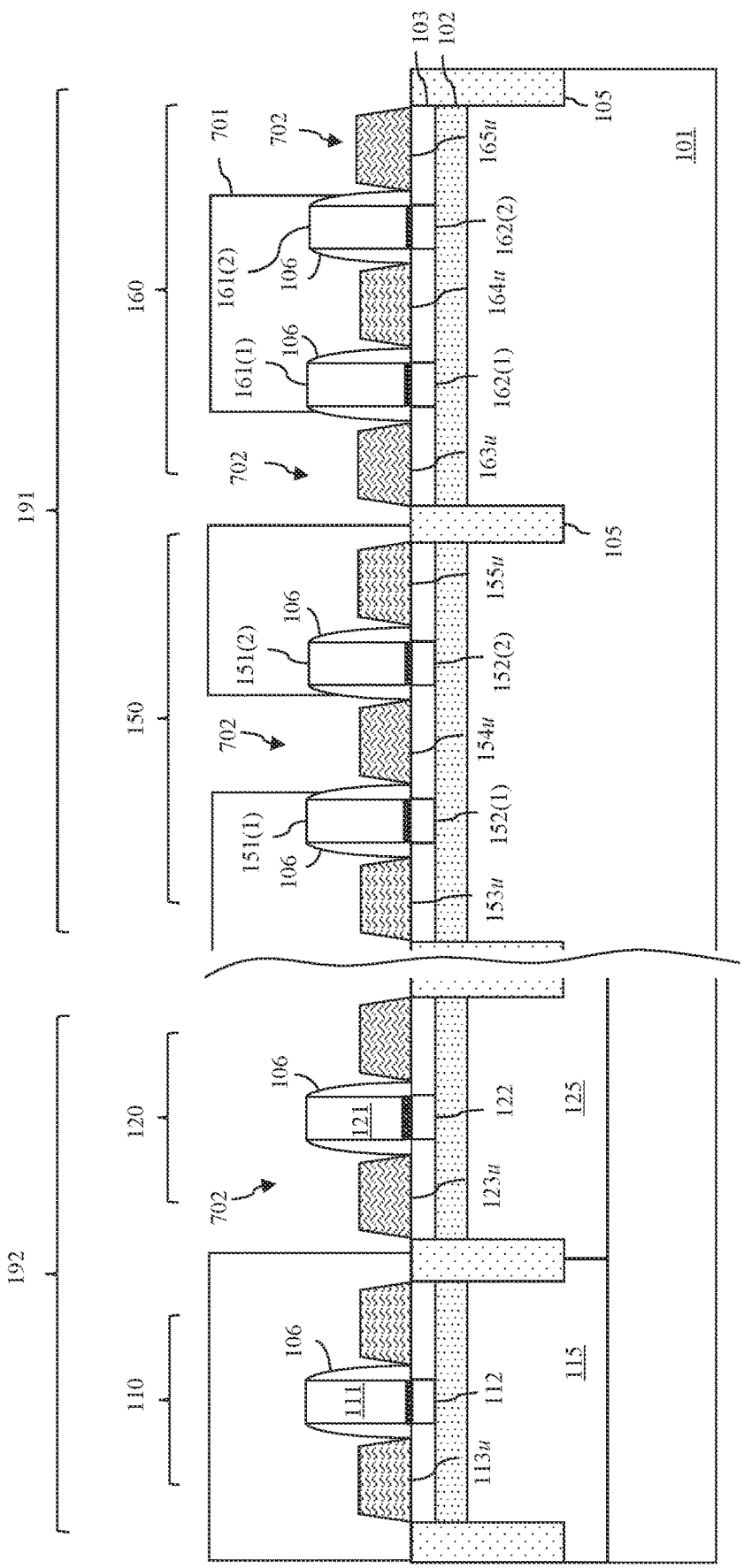

Next, in-situ doped epitaxial semiconductor layers (e.g., in-situ doped epitaxial silicon layers) can be formed on the semiconductor layer 103 in order to form upper portions of the emitter 153, 163, base 154, 164, and collector 155, 165 of each BJT 150, 160 in the BJT area 191 and upper portions of the source/drain regions 113, 123 of each FET 110, 120 in the FET area 192 (see process step 214 and FIGS. 6-7). Specifically, a mask 601 can be formed over the partially completed structure and patterned with openings 602 in the BJT area 191 and in the FET area 192 exposing portions of the semiconductor layer corresponding to areas designated for the emitter 153 and collector 155 of the NPN-type BJT 150, to an area designated for the base 164 of the PNP-type BJT 160, and to areas designated for the source/drain regions 113 of the NFET 110. N+ epitaxial semiconductor layers (i.e., epitaxial semiconductor layers in-situ doped with an N-type dopant) can then be formed on the exposed portions of the semiconductor layer 103, thereby forming upper portions of the emitter 153 and collector 155 of the NPN-type BJT 150, an upper portion for the base 164 of the PNP-type BJT 160, and upper portions of the source/drain regions 113 of the NFET 110 (see FIG. 6). The mask 601 can be selectively removed. Additionally, a mask 701 can be formed over the partially completed structure and patterned with openings 702 in the BJT area 191 and in the FET area 192 exposing portions of the semiconductor layer corresponding to areas designated for the emitter 163 and collector 165 of the PNP-type BJT 160, to an area designated for the base 154 of the NPN-type BJT 150, and to areas designated for the source/drain regions 123 of the PFET 120 (see FIG. 7). P+ epitaxial semiconductor layers (i.e., epitaxial semiconductor layers in-situ doped with a P-type dopant) can then be formed on the exposed portions of the semiconductor layer 103, thereby forming upper portions of the emitter 163 and collector 165 of the PNP-type BJT 160, an upper portion for the base 154 of the NPN-type BJT 150, and upper portions of the source/drain regions 123 of the PFET 120. The mask 701 can be selectively removed.

Figure 8:
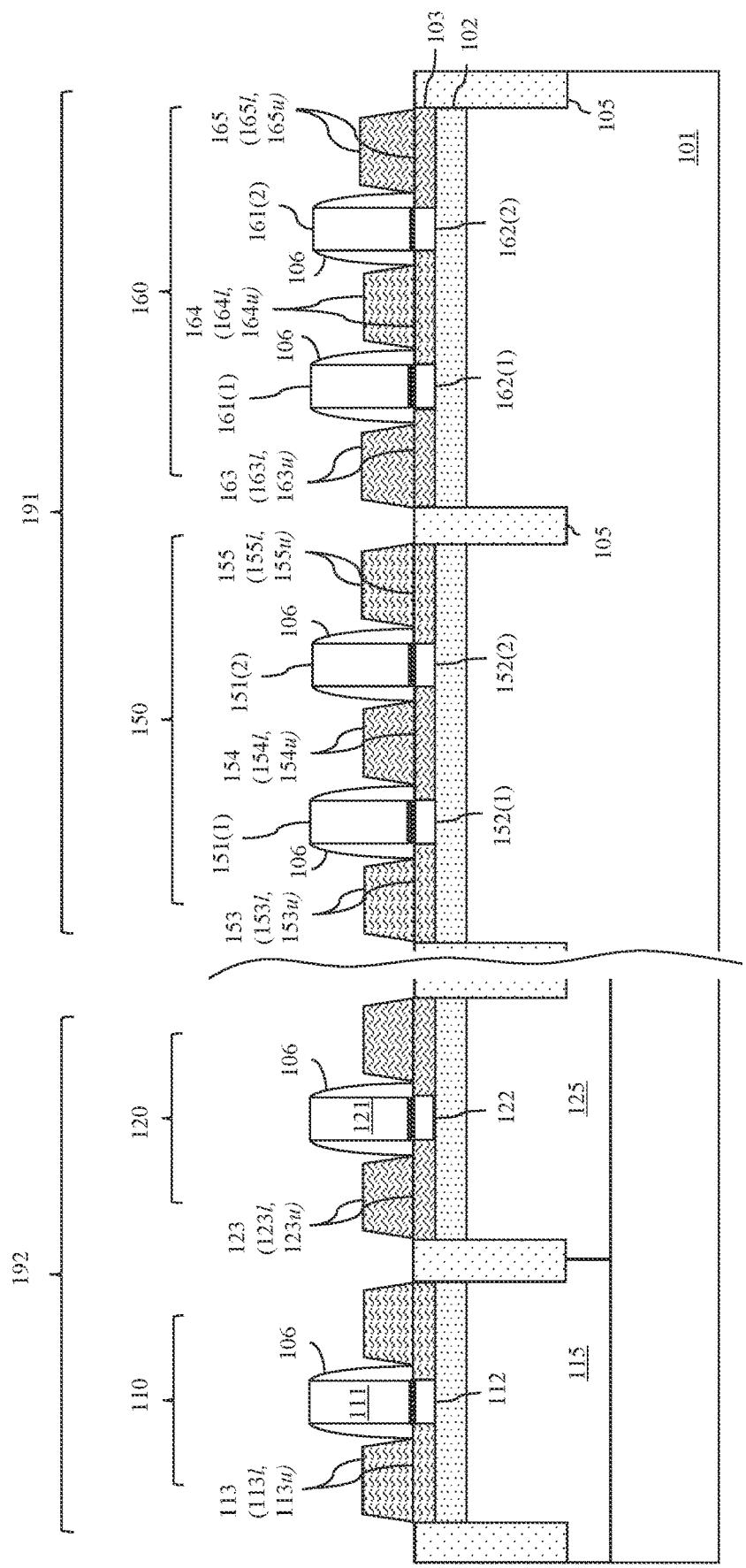

It should be noted that if the lower portions of the emitter 153, 163, base 154, 164, collector 155, 165 and source/drain regions 113, 123 within the semiconductor layer 103 were not doped at process step 212, an anneal process can be performed in order to drive dopants from those upper portions (i.e., from the doped epitaxial semiconductor layers deposited at process step 214) into semiconductor layer 103 below (see process step 216 and FIG. 8). This anneal process step can be used to ensure that all portions of the emitter 153, 163, base 154, 164, collector 155, 165 and source/drain regions 113, 123, including the lower portions of these features within the semiconductor layer 103, have the appropriate conductivity type and level.

Figure 9:
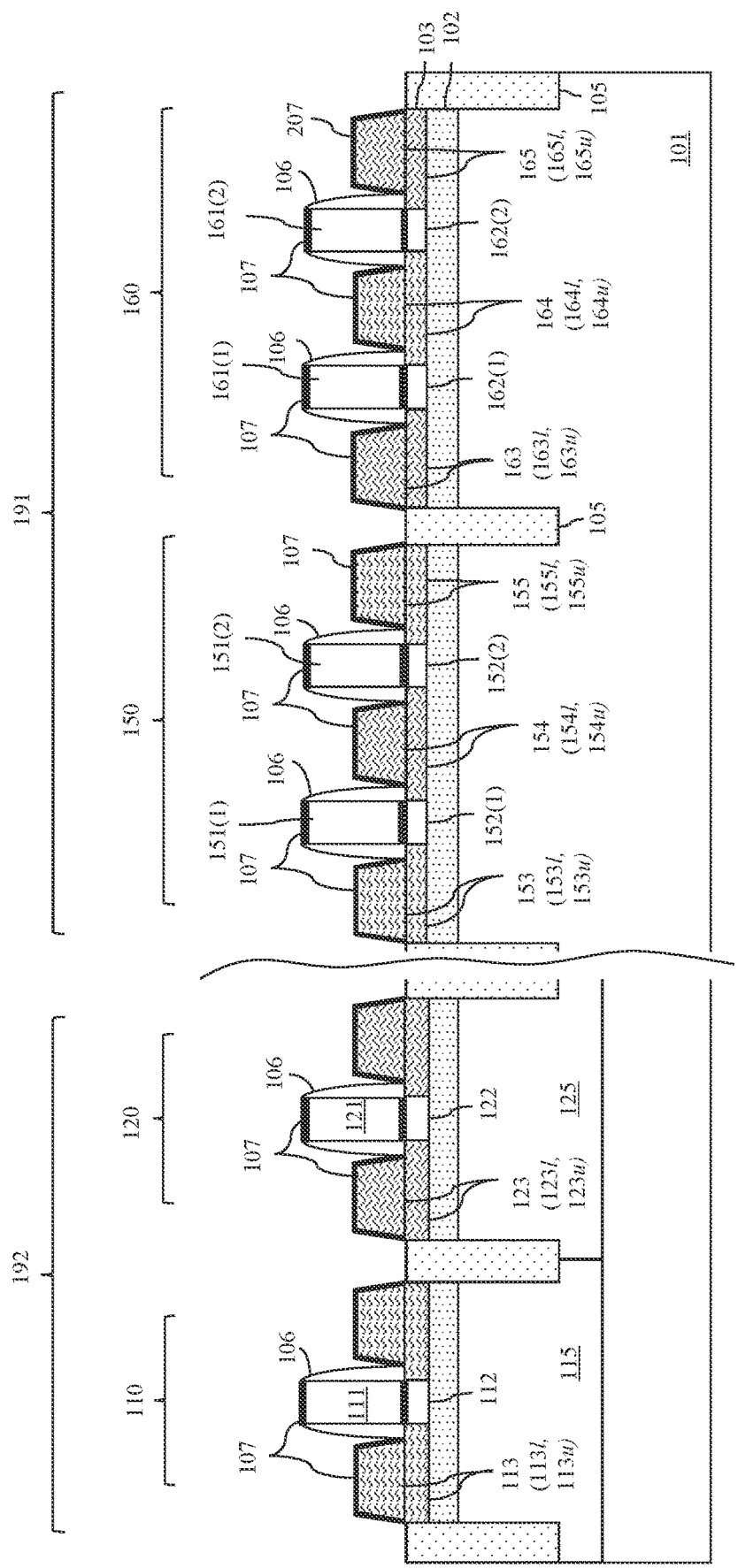

Additional processing can then be performed in order to complete the structures of the NPN-type BJT 150, the PNP-type BJT 160, the NFET 110 and the PFET 120. For example, metal silicide layers 107 can be formed on exposed semiconductor surfaces in the BJT area 191 and FET area 192 (see process step 218 and FIG. 9). The metal silicide layers 107 can be formed, for example, using a conventional self-aligned process. As a result, metal silicide layers 107 can be formed on polysilicon surfaces at the top of the first and second gate structures 151(1)-151(2), 161(1)-161(2) of the BJTs 150, 160 and at the top of the additional gate structures 111, 121 of the FETs 110, 120. Metal silicide layers 107 can also be formed on the silicon surfaces of the emitter 153, 163, base 154, 164, and collector 155, 165 of the BJTs 150, 160 and of the source/drain regions 113, 123 of the FETs 110, 120. The metal silicide layers 107 can be, for example, layers of cobalt silicide (CoSi), nickel silicide (NiSi), tungsten silicide (WSi), titanium silicide (TiSi), or any other suitable metal silicide material.

Following the self-aligned silicide process, conventional middle-of-the-line (MOL) process can be performed (see process step 220 and FIG. 1). This MOL process can include, but is not limited to, deposition of one or more layers of dielectric material over the partially completed structure and formation of contacts through the dielectric material to various device components. For each BJT 150, 160, the MOL contacts can include primary contacts to primary terminals 199 (i.e., to the emitter 153, 163, the base 154, 164 and the collector 155, 165) and, optionally, secondary contact(s) to secondary terminal(s) 198 (i.e., to the first gate structure 151(1), 161(1), the second gate structure 151(2), 161(2), and/or the semiconductor substrate 101). As discussed above with regard to the structure embodiments, during BJT operation, the secondary terminal(s) 198 can be selectively biased in addition to the primary terminals 199 in order to modulate DC characteristics and, thereby optimize BJT performance. For each FET 110, 120, the MOL contacts can include primary contacts to primary terminals 197 (i.e., to the source/drain regions 113, 123 and the gate structure 111, 121) and, optionally, a secondary contact to a secondary terminal 196 (i.e., to the well region 115, 125). As discussed above with regard to the structure embodiments, during FET operation, the secondary terminal 196 can be selectively biased in addition to the primary terminals 197 in order to modulate the threshold voltage (Vt) of the particular FET.

It should be noted that in the method embodiments described above and illustrated in the drawings gate-first gate processing is performed at process step 210. However, it should be understood that the description and drawings of the disclosed method embodiments are provided for illustration purposes and are not intended to be limiting. Alternative method embodiments could include the formation of dummy gate structures at process step 210 and the removal of the dummy gate structures and the formation of replacement metal gate (RMG) structures prior to MOL processing at process step 220. Various different techniques for dummy gate formation and RMG formation are well known in the art and, thus, the details of these techniques have been omitted from this specification in order to allow the reader to focus on the salient aspects of the disclosed embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In the structures and methods described above a semiconductor refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bipolar junction transistor comprising:
   a semiconductor substrate;
   an insulator layer immediately adjacent to the semiconductor substrate;
   a semiconductor layer immediately adjacent to the insulator layer;
   a first extension region in the semiconductor layer and extending laterally between an emitter and a base;
   a second extension region in the semiconductor layer and extending laterally between the base and a collector, wherein the first extension region and the second extension region have at least one of a different conductivity type and a different conductivity level than each of the base, the emitter, and wherein bottom surfaces of the first extension region, the second extension region, the base, the emitter, and the collector are immediately adjacent to the insulator layer;

a first gate structure on the first extension region; and
a second gate structure on the second extension region, wherein contacts extend to the first gate structure and the second gate structure.

2. The bipolar junction transistor of claim 1,
wherein the base comprises: a lower base portion in the semiconductor layer; and an upper base portion on the lower base portion,
wherein the emitter comprises: a lower emitter portion in the semiconductor layer; and an upper emitter portion on the lower emitter portion,
wherein the collector comprises: a lower collector portion in the semiconductor layer; and an upper collector portion on the lower collector portion,
wherein the upper base portion, the upper emitter portion, and the upper collector portion comprise epitaxial semiconductor layers,
wherein the first gate structure has first opposing sidewalls, has symmetric first gate sidewall spacers on the first opposing sidewalls, is positioned laterally between the upper emitter portion and the upper base portion, and is electrically isolated from the upper emitter portion and the upper base portion by the symmetric first gate sidewall spacers,
wherein the second gate structure has second opposing sidewalls, has symmetric second gate sidewall spacers on the second opposing sidewalls, is positioned laterally between and the upper base portion and the upper collector portion, and is electrically isolated from the upper base portion and the upper collector portion by the symmetric second gate sidewall spacers, and
wherein the first gate structure and the second gate structure are biasable through the contacts to modulate DC characteristics of the bipolar junction transistor.

3. The bipolar junction transistor of claim 1, wherein the emitter and the collector have a different type conductivity than the base and wherein the first extension region and the second extension region have a same type conductivity as the base.

4. The bipolar junction transistor of claim 1, wherein the emitter and the collector have a different type conductivity than the base and wherein the first extension region and the second extension region have a same type conductivity as the emitter and the collector.

5. The bipolar junction transistor of claim 4, wherein the first extension region has a different conductivity level than the second extension region.

6. A semiconductor structure comprising:
a semiconductor substrate;
an insulator layer immediately adjacent to the semiconductor substrate;
a semiconductor layer immediately adjacent to the insulator layer;
first trench isolation regions extending through the semiconductor layer and the insulator layer and into the semiconductor substrate, wherein a first device area is positioned laterally between the first trench isolation regions and wherein a portion of the semiconductor substrate aligned below the first device area is devoid of any well regions;
second trench isolation regions extending through the semiconductor layer and the insulator layer and into the semiconductor substrate, wherein a second device area is positioned laterally between the second trench isolation regions;
a bipolar junction transistor comprising:
a first extension region in the first device area and extending laterally between an emitter and a base;
a second extension region in the first device area and extending laterally between the base and a collector, wherein the first extension region and the second extension region have at least one of a different conductivity type and a different conductivity level than each of the base, the emitter, and the collector and wherein bottom surfaces of the first extension region, the second extension region, the base, the emitter, and the collector are immediately adjacent to the insulator layer;
a first gate structure on the first extension region; and
a second gate structure on the second extension region;
contacts, wherein at least some of the contacts are on the first gate structure and the second gate structure; and
a field effect transistor comprising:
a channel region in the second device area and extending laterally between source/drain regions;
a well region in a portion of the semiconductor substrate aligned below the second device area and immediately adjacent to the insulator layer, wherein the second trench isolation regions extend into the well region;
a back gate structure comprising the well region and a section of the insulator layer adjacent to the channel region; and
an additional gate structure on the channel region.

7. The semiconductor structure of claim 6,
wherein the base of the bipolar junction transistor comprises: a lower base portion in the first device area; and an upper base portion on the lower base portion,
wherein the emitter of the bipolar junction transistor comprises: a lower emitter portion in the first device area; and an upper emitter portion on the lower emitter portion,
wherein the collector of the bipolar junction transistor comprises: a lower collector portion in the first device area; and an upper collector portion on the lower collector portion,
wherein the first gate structure of the bipolar junction transistor has first opposing sidewalls, has symmetric first gate sidewall spacers on the first opposing sidewalls, is positioned laterally between the upper emitter portion and the upper base portion and is isolated from the upper emitter portion and the upper base portion by the symmetric first gate sidewall spacers,
wherein the second gate structure of the bipolar junction transistor has second opposing sidewalls, has symmetric second gate sidewall spacers on the second opposing sidewalls, is positioned laterally between the upper base portion and the upper collector portion and is electrically isolated from the upper base portion and the upper collector portion by the symmetric second gate sidewall spacers,
wherein each source/drain region of the field effect transistor comprises: a lower source/drain portion in the second device area; and an upper source/drain portion on the lower source/drain portion,
where the additional gate structure of the field effect transistor is positioned laterally between and electrically isolated from the source/drain regions, and
wherein the upper base portion, the upper emitter portion, the upper collector portion, and each source/drain portion comprise epitaxial semiconductor layers.

8. The semiconductor structure of claim 6, wherein the emitter and the collector have a different type conductivity than the base and wherein the first extension region and the second extension region have a same type conductivity as the base.

9. The semiconductor structure of claim 6, wherein the emitter and the collector have a different type conductivity than the base and wherein the first extension region and the second extension region have a same type conductivity as the emitter and the collector.

10. The semiconductor structure of claim 9, wherein the first extension region has a different conductivity level than the second extension region.

11. The semiconductor structure of claim 6,
wherein the contacts comprise: primary contacts to the emitter, the base, the collector, and the semiconductor substrate; and secondary contacts to the first gate structure and the second gate structure, and
wherein the first gate structure and the second gate structure are biasable through the secondary contacts to modulate DC characteristics of the bipolar junction transistor.

12. The semiconductor structure of claim 6,
wherein the contacts further comprise additional contacts to the source/drain regions, the additional gate structure, and the well region.

13. A method comprising:
forming gate structures on a semiconductor layer, wherein the semiconductor layer is immediately adjacent to an insulator layer and the insulator layer is immediately adjacent to a semiconductor substrate; and
forming a bipolar junction transistor comprising:
a first extension region in the semiconductor layer and extending laterally between an emitter and a base;
a second extension region in the semiconductor layer and extending laterally between the base and a collector, wherein the first extension region and the second extension region have at least one of a different conductivity type and a different conductivity level than each of the base, the emitter, and the collector and wherein bottom surfaces of the first extension region, the second extension region, the base, the emitter, and the collector are immediately adjacent to the insulator layer;
a first gate structure of the gate structures on the first extension region; and
a second gate structure of the gate structures on the second extension region, wherein contacts extend to the first gate structure and the second gate structure.

14. The method of claim 13,
wherein the base comprises: a lower base portion in the semiconductor layer; and an upper base portion on the lower base portion,
wherein the emitter comprises: a lower emitter portion in the semiconductor layer; and an upper emitter portion on the lower emitter portion,
wherein the collector comprises: a lower collector portion in the semiconductor layer; and an upper collector portion on the lower collector portion,
wherein the first gate structure has first opposing sidewalls, has symmetric first gate sidewalls spacers on the first opposing sidewalls, is positioned laterally between the upper emitter portion and the upper base portion and is electrically isolated from the upper emitter portion and the upper base portion by the symmetric first gate sidewall spacers,
wherein the second gate structure has second opposing sidewalls, has symmetric second gate sidewalls spacers on the second opposing sidewalls, is positioned laterally between the upper base portion and the upper collector portion and is electrically isolated from the upper base portion and the upper collector portion by the symmetric second gate sidewall spacers, and
wherein the upper base portion, the upper emitter portion, and the upper collector portion comprise epitaxial semiconductor layers.

15. The method of claim 14, wherein the epitaxial semiconductor layers are doped so that the emitter and the collector have a different type conductivity than the base and wherein the first extension region and the second extension region are doped so as to have a same type conductivity as the base at a lower conductivity level than the base.

16. The method of claim 14, wherein the epitaxial semiconductor layers are doped so that the emitter and the collector have a different type conductivity than the base and wherein the first extension region and the second extension region are doped so that the first extension region and the second extension region have a same type conductivity as the emitter and the collector.

17. The method of claim 16, wherein the first extension region and the second extension region are doped so that the first extension region has a higher conductivity level than the second extension region.

18. The method of claim 13, wherein the semiconductor layer is on an insulator layer and the insulator layer is on a semiconductor substrate and wherein the method further comprises forming contacts comprising: primary contacts to the emitter, the base, the collector and the semiconductor substrate; and secondary contacts to the first gate structure and the second gate structure, wherein the first gate structure and the second gate structure are biasable through the secondary contacts to modulate DC characteristics of the bipolar junction transistor.

19. The method of claim 18,
wherein the forming of the bipolar junction transistor is performed using a first device area of the semiconductor layer over a portion of the semiconductor substrate devoid of any well regions, and
wherein the method further comprises forming a field effect transistor using a second device area of the semiconductor substrate such that the field effect transistor comprises:
a channel region in the second device area adjacent to the insulator layer and extending laterally between source/drain regions;
an additional gate structure of the gate structures on the channel region;
a well region in the semiconductor substrate immediately adjacent to the insulator layer and aligned below the second device area; and
a back gate structure comprising the well region and a section of the insulator layer aligned below the channel region.

20. The method of claim 19, wherein the forming of the contacts further comprises forming additional contacts to the source/drain regions, the additional gate structure, and the well region.

* * * * *